United States Patent [19]

Romeo et al.

[11] 4,413,239
[45] Nov. 1, 1983

[54] FIELD EFFECT TRANSISTOR CIRCUIT FOR MODULATOR AND DEMODULATOR APPLICATIONS

[75] Inventors: Donald E. Romeo, Westminister; George W. McIver, Redondo Beach, both of Calif.

[73] Assignee: The United States of America as represented by the Secretary of the Navy, Washington, D.C.

[21] Appl. No.: 276,224

[22] Filed: Jun. 22, 1981

[51] Int. Cl.$^3$ .......................... H03C 1/00; H03D 1/18; G06G 7/161
[52] U.S. Cl. ................................ 332/16 T; 332/31 T; 329/103; 307/498; 328/160; 455/333
[58] Field of Search ................................. 329/101–103, 329/110; 332/9 T, 16 T, 31 T; 307/511, 514, 516, 525, 498; 455/333; 328/160

[56] References Cited

U.S. PATENT DOCUMENTS

| | | | |
|---|---|---|---|
| 3,980,900 | 9/1976 | Ishigaki et al. | 329/103 |
| 3,988,598 | 10/1976 | Ishigaki et al. | 329/103 |
| 4,058,771 | 11/1977 | Ohsawa et al. | 455/333 X |
| 4,338,580 | 7/1982 | Gay | 332/31 T |

FOREIGN PATENT DOCUMENTS 54-100617  8/1979  Japan .................................. 455/333

Primary Examiner—Siegfried H. Grimm
Assistant Examiner—Edward P. Westin
Attorney, Agent, or Firm—Robert F. Beers; Thomas M. Phillips

[57] ABSTRACT

A double balanced modulator-demodulator consisting of two pairs of field effect transistors. A field effect transistor is connected in series between the source electrodes of each of the field effect transistor pairs. The field effect transistors making up each pair are biased so that they operate in the saturated mode. Each of the transistors connected between the source electrodes of the transistor pairs are biased to operate in the linear mode such that drain current varies linearly with drain voltage. A first input signal is connected across the gate electrodes of the transistor pairs while a second input signal is connected across the gate electrodes of the connecting transistors. Bias for each of the transistor pairs is provided by means of a field effect transistor connected between the source electrodes of the transistor pairs and ground. The gates and source electrodes of transistors forming the bias circuit are connected to ground. The outputs of the two pairs are connected in parallel such that the differential output current is proportional to the product of the input signals.

2 Claims, 1 Drawing Figure

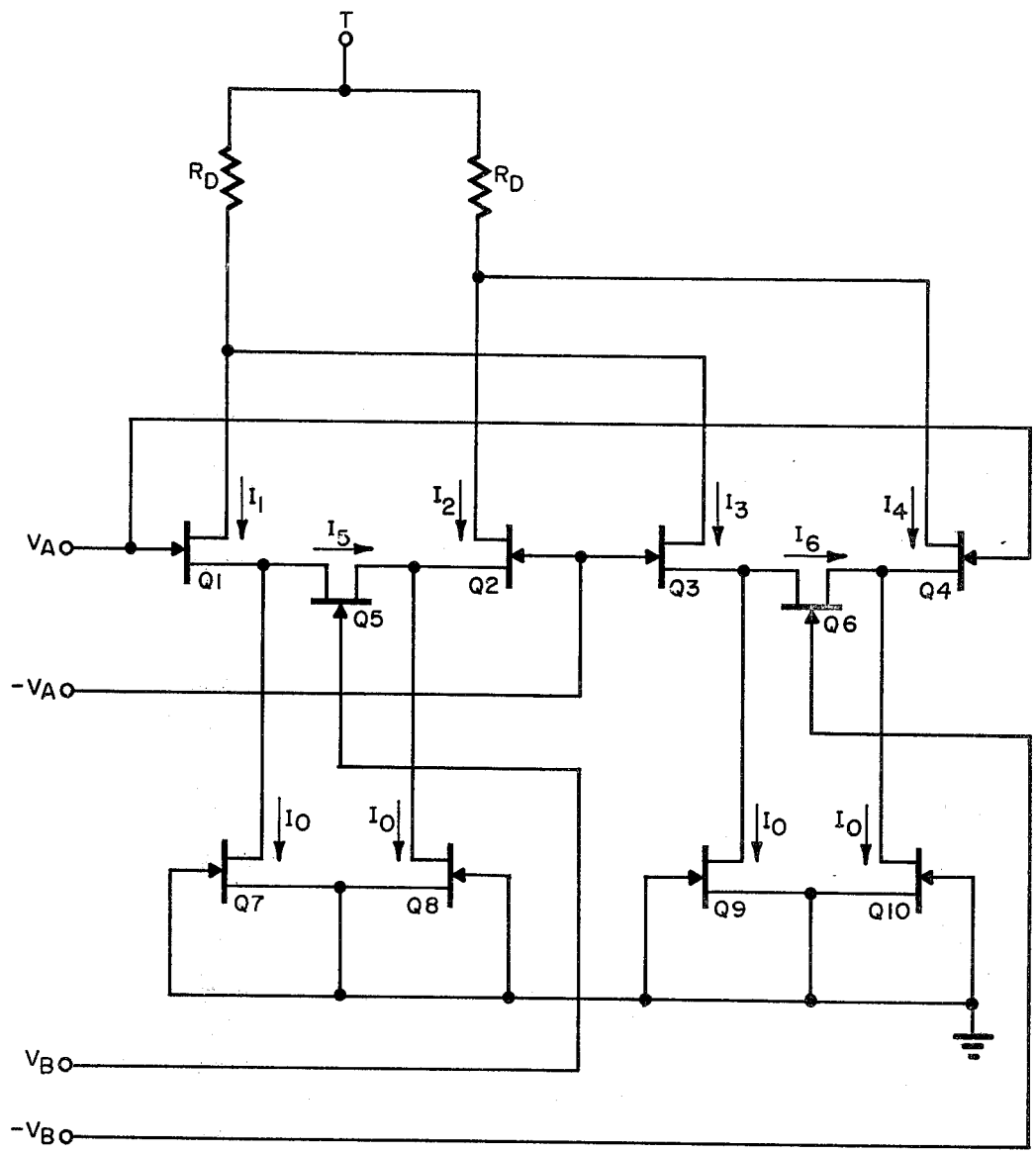

FIELD EFFECT TRANSISTOR CIRCUIT FOR MODULATOR AND DEMODULATOR APPLICATIONS

BACKGROUND OF THE INVENTION

Various types of balanced and double-balanced modulator and demodulator circuits are well known in the patented prior art. In the known systems, filters and other frequency sensitive circuits are required to eliminate unwanted signals such as device-generated harmonics of the carrier and modulating signals. Some circuits depend upon the modulation of device transconductance with current level as is the case for conventional double-balanced modulators.

SUMMARY OF THE INVENTION

The present invention provides a field effect transistor circuit for application to high frequency modulators or demodulators. Two differential inputs are applied to the gates of field effect transistors, and it is intended that the differential output current be proportional to the product of the input signals. Field effect transistor pairs are arranged so that they are operated in the saturated mode such that drain current varies with the gate voltage but not the drain voltage. Transistors connecting each of the pairs of transistors are operated in the linear mode (unsaturated mode) such that drain current varies linearly with drain voltage. The transconductance of the devices in saturation is reduced by the presence of the series feedback across the connected linear devices. The output will be proportional to the product of the input signals with all other current components that are not product terms cancelled out.

OBJECTS OF THE INVENTION

Accordingly, an object of the present invention is to provide an improved modulating and demodulating circuit that does not depend upon the modulation of device transconductance with current level.

Another object of the invention is the provision of an improved modulating and demodulating circuit wherein use of current source biasing of the differential pairs permit the signal impedance levels to be optimized independently of the biasing.

Another object is the provision of an improved modulating and demodulating circuit that is relatively insensitive to device transconductance.

Other objects, advantages and novel features of the invention will become apparent from the following detailed description of the invention when considered in conjunction with the accompanying drawings wherein there is shown in the single FIGURE a circuit diagram of a double-balanced modulator-demodulator embodying the invention.

Referring now to the drawing wherein there is shown in the schematic diagram, a first differential input (signal to be demodulated or modulating signal), $V_A, -V_A$ is applied to the gate electrodes of field effect transistors Q1, Q2, Q3 and Q4. A second differential input signal (local oscillator or carrier signal), $V_B, -V_B$ is applied to the gate electrodes of field effect transistors Q5 and Q6. As shown, field effect transistor Q5 is connected in series between the source electrode of Q1 and the source electrode of Q2 while field effect transistor Q6 is connected in series between the source electrode of Q3 and source electrode of Q4. Since field effect transistors Q5 and Q6 are biased by bias current, $I_0$, in the linear mode of operation, their source and drain electrodes are interchangeable. The drain electrodes of Q1 and Q3 are connected in parallel through a first load resistor RD to a bias voltage source at terminal T. The drain electrodes of Q2 and Q4 are connected in parallel through load resistor $R_D$ to bias voltage source at Terminal T. The output signal appears across load resistors $R_D$.

The source electrodes of Q1, Q2, Q3 and Q4 are each connected to ground thru field effect transistors Q7, Q8, Q9 and Q10 respectively.

In the configuration shown transistor pairs Q1, Q2 and Q3, Q4 are operated in the saturated mode such that drain currents $I_1 - I_4$ vary with the gate voltage but not the drain voltage. Transistors Q5 and Q6 are operated in the linear mode (unsaturated mode) such that drain currents $I_5$ and $I_6$ vary linearly with drain voltage. The transconductance of the devices in saturation Q1, Q2 and Q3, Q4 is reduced by the presence of series feedback across the linear devices Q5 and Q6. The circuit transconductance is then given by:

$$G = \frac{g_m}{1 + (g_m R_D)/2} \quad (1)$$

where $g_m$ = device transconductance
$R_D$ = linear device drain resistance

The small signal drain resistance variation, which can be defined as $$\Delta R_D = \frac{\partial R_D}{\partial V_B} \Delta V_B, \quad (2)$$

is linearly related to the input signal $V_B$. Hence, the output current will contain a component that is proportional to the product of the input signals. In the double balanced modulator configuration shown, the output currents $I_1 - I_4$ are summed and current components that are not product terms are cancelled out. It can be shown that the output current is given by:

$$I_1 - I_2 = 2G^2 \Delta R_D V_A = 2G^2 (\partial R_D / \partial V_B) V_A V_B \quad (3)$$

For sinusoidal input signals $$V_A = V_A' \cos \omega_A t, \; V_B = V_B' \cos \omega_B t \quad (4)$$

The output is $$I_1 - I_2 = [\text{constant}][\cos (\omega_A + \omega_B)t + \cos (\omega_A - \omega_B)t] \quad (5)$$

where $V_A'$ and $V_B'$ are constants of proportionality and $\omega_A$ and $\omega_B$ are angular frequencies of the input voltages $V_A$ and $V_B$, respectively.

The above described circuit is especially suited to the use of silicon or gallium arsenide Schottky barrier diode gate field effect transistors.

Obviously many modifications and variations of the present invention are possible in the light of the above teachings. It is therefore to be understood that within the scope of the appended claims the invention may be practiced otherwise than as specifically described.

We claim:

1. Apparaus for producing a signal proportional to the product of two differential input signals comprising: first and second pairs of field effect transistors, each of the field effect transistors of said first and second pairs having gate, source and drain electrodes, a first series connected field effect transistor having a source electrode and a drain electrode connected in series between the source electrodes of one of said pairs of field effect transistors and having a gate electrode, a second series connected field effect transistor having a source electrode and a drain electrode connected in series between the source electrodes of the other of said pairs of field effect transistors and having a gate electrode, said source electrodes of said pairs of field effect transistors being held at a common reference potential, means for applying a first differential input signal across the gate electrodes of each of said pairs in parallel, means for applying a second differential input signal across the gate electrodes of said first and second series connected field effect transistors, and loading circuit means connected to the drain electrodes of said pairs of field effect transistors for providing an output signal proportional to the product of said first and second differential input signals.

2. The apparatus of claim 1 wherein said first and second series connected field effect transistors are biased in the linear mode of operation such that their source and drain electrodes are interchangeable.